(12) United States Patent
Triyoso et al.

(10) Patent No.: US 8,791,003 B2
(45) Date of Patent: Jul. 29, 2014

(54) METHODS FOR FABRICATING INTEGRATED CIRCUITS WITH FLUORINE PASSIVATION

(75) Inventors: Dina Triyoso, Dresden (DE); Elke Erben, Dresden (DE); Robert Binder, Dresden (DE)

(73) Assignee: Globalfoundries, Inc., Grand Cayman (KY)

( * ) Notice: Subject to any disclaimer, the term of this patent is extended or adjusted under 35 U.S.C. 154(b) by 0 days.

(21) Appl. No.: 13/529,327

(22) Filed: Jun. 21, 2012

(65) Prior Publication Data

US 2013/0344692 A1    Dec. 26, 2013

(51) Int. Cl.
*H01L 21/283* (2006.01)
*H01L 21/31* (2006.01)

(52) U.S. Cl.
USPC .. 438/591; 438/785; 257/E21.19; 257/E21.24

(58) Field of Classification Search
CPC ...................................................... H01L 21/283
USPC .......................................................... 438/591
See application file for complete search history.

(56) References Cited

U.S. PATENT DOCUMENTS

| | | | | |
|---|---|---|---|---|
| 7,741,230 | B2 * | 6/2010 | Rachmady et al. | 438/754 |
| 2006/0177987 | A1 * | 8/2006 | Bergman | 438/396 |
| 2008/0076268 | A1 * | 3/2008 | Kraus et al. | 438/785 |
| 2009/0057745 | A1 * | 3/2009 | Yin et al. | 257/315 |
| 2010/0244153 | A1 * | 9/2010 | Hsu et al. | 257/408 |
| 2010/0327373 | A1 | 12/2010 | Carter et al. | |
| 2011/0081775 | A1 * | 4/2011 | Pierreux et al. | 438/591 |
| 2011/0169104 | A1 * | 7/2011 | Xu et al. | 257/410 |
| 2012/0269962 | A1 * | 10/2012 | Blomberg et al. | 427/126.3 |

FOREIGN PATENT DOCUMENTS

WO    WO 2011/049816    *  4/2011 ............. C23C 14/06

* cited by examiner

*Primary Examiner* — Mark A Laurenzi
*Assistant Examiner* — Mounir Amer
(74) *Attorney, Agent, or Firm* — Ingrassia Fisher & Lorenz, P.C.

(57) ABSTRACT

Methods for fabricating integrated circuits are provided. In an embodiment, a method for fabricating an integrated circuit includes providing a semiconductor substrate and forming a gate structure on the semiconductor substrate. The gate includes a high-k dielectric material. In the method, a fluorine-containing liquid is contacted with the high-k dielectric material and fluorine is incorporated into the high-k dielectric material.

20 Claims, 5 Drawing Sheets

US 8,791,003 B2

METHODS FOR FABRICATING INTEGRATED CIRCUITS WITH FLUORINE PASSIVATION

TECHNICAL FIELD

The present disclosure generally relates to methods for fabricating integrated circuits, and more particularly relates to methods for fabricating integrated circuits that passivate high-k dielectric with fluorine.

BACKGROUND

The introduction of high-k and metal gate materials in scaled CMOS technologies faces significant difficulties due to severe threshold voltage instability and performance degradation of the devices. These problems are related to the high amount of bulk defects and interface states in the high-k/metal gate stack, leading to negative bias temperature instability (NBTI) and positive bias temperature instability (PBTI) issues.

In order to make high-k metal gates manufacturable, reliability must be improved. Fluorine is known to passivate high-k dielectric materials by reducing the number of interface and bulk defects. The bonds formed by fluorine in high-k dielectric materials are particularly strong and allow the passivation to be maintained despite the standard high temperature CMOS processing. Thus, fluorine passivation results in a robust defect passivation that allows better withstanding of the normal device operation conditions, leading to improved NBTI and PBTI behavior. A conventional method for fluorine incorporation uses a fluorine plasma implantation technique. However, this technique is difficult to control and often causes damage to the gate structure.

Accordingly, it is desirable to provide methods for fabricating integrated circuits with high-k dielectric material passivated by fluorine. In addition, it is desirable to provide methods for fabricating integrated circuits which avoid use of plasma implantation. Furthermore, other desirable features and characteristics will become apparent from the subsequent detailed description and the appended claims, taken in conjunction with the accompanying drawings and the foregoing technical field and background.

BRIEF SUMMARY

Methods for fabricating integrated circuits are provided. In accordance with one embodiment, a method for fabricating an integrated circuit includes providing a semiconductor substrate and forming a gate structure on the semiconductor substrate. The gate includes a high-k dielectric material. In the method, a fluorine-containing liquid is contacted with the high-k dielectric material and fluorine is incorporated into the high-k dielectric material.

In another embodiment, a method for fabricating an integrated circuit includes forming a high-k dielectric gate material on a semiconductor substrate. The high-k dielectric gate material is passivated by applying a fluorine-containing liquid to the high-k dielectric gate material.

In accordance with another embodiment, a method for fabricating an integrated circuit includes forming a high-k dielectric gate material on a semiconductor substrate. A capping layer is deposited over the high-k dielectric gate material. Then, a fluorine-containing liquid is flowed onto the capping layer. The fluorine-containing liquid removes the capping layer and incorporates fluorine into the high-k dielectric gate material to form a fluorine-passivated layer within the high-k dielectric gate material.

BRIEF DESCRIPTION OF THE DRAWINGS

Embodiments of methods for fabricating integrated circuits with passivated high-k dielectric material will hereinafter be described in conjunction with the following drawing figures, wherein like numerals denote like elements, and wherein.

DETAILED DESCRIPTION

The following detailed description is merely exemplary in nature and is not intended to limit the methods for fabricating integrated circuits as claimed herein. Furthermore, there is no intention to be bound by any expressed or implied theory presented in the preceding technical field, background or brief summary, or in the following detailed description.

In accordance with the various embodiments herein, methods for fabricating integrated circuits with fluorine-passivated high-k dielectric gate structures are provided. Problems with conventional processes for passivating high-k gate dielectric may be reduced. Specifically, conventional plasma passivation techniques are difficult to control and often cause damage to gate structures. In the fluorine passivation process claimed herein, a fluorine-containing liquid is used rather than plasma. Specifically, a fluorine-containing liquid is flowed onto or into contact with the high-k gate dielectric to incorporate fluorine therein. Process steps before and after fluorine incorporation may be varied depending on the desired structure and/or process flow.

FIGS. 1-15 illustrate steps in accordance with various embodiments of methods for fabricating integrated circuits. Various steps in the design and composition of integrated circuits are well known and so, in the interest of brevity, many conventional steps will only be mentioned briefly herein or will be omitted entirely without providing the well-known process details. Further, it is noted that integrated circuits include a varying number of components and that single components shown in the illustrations may be representative of multiple components.

Figure 1:
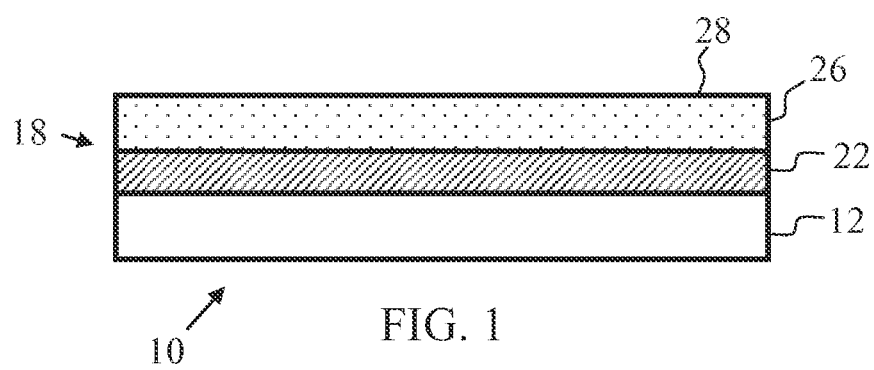
FIGS. 1-15 illustrate, in cross section, a portion of an integrated circuit and method steps for fabricating an integrated circuit in accordance with various embodiments herein.

In FIG. 1, in an exemplary embodiment, the process of fabricating an integrated circuit 10 begins by providing a semiconductor substrate 12. A gate stack 18 is formed on the semiconductor substrate 12, such as by blanket layer deposition. As shown, the high-k gate stack 18 may include a gate oxide layer 22, such as silicon dioxide, and a high-k gate dielectric material layer 26, such as a hafnium-based or zirconium-based dielectric, for example, hafnium oxide ($HfO_2$). The high-k gate dielectric material 26 has a surface 28. The high-k gate dielectric material 26 typically has a thickness of about 20 Angstroms, or in certain embodiments about 10 Angstroms. The high-k gate dielectric material 26 can be deposited by any appropriate deposition technique, including physical vapor deposition (PVD) or metalorganic chemical vapor deposition (MOCVD).

Figure 2:
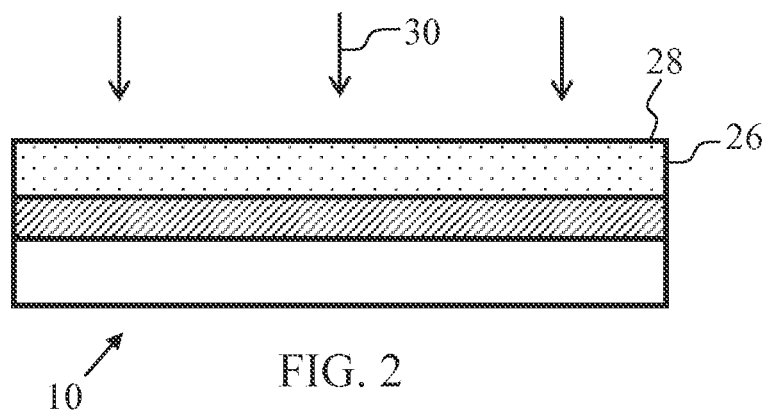

In the exemplary embodiment of FIG. 2, the high-k gate dielectric material 26 is passivated by flowing a fluorine-containing liquid 30 onto the surface 28 of the high-k gate dielectric material 26. The fluorine-containing liquid 30 may be for example, diluted hydrofluoric acid (dHF). An exemplary dHF is one part HF dissolved in 300 parts water and contacted at ambient temperature. The duration of contact between the fluorine-containing liquid 30 and the high-k gate dielectric material 26 will depend on the concentration of fluorine in the fluorine-containing liquid 30 and on properties of the fluorine-containing liquid 30 that affect the rate of incorporation of fluorine into the high-k gate dielectric material 26. In an exemplary embodiment, the fluorine-containing liquid 30 may be contacted with the high-k gate dielectric material 26 for a selected duration, such as less than about a minute, for example, for about 30 seconds.

Figure 3:
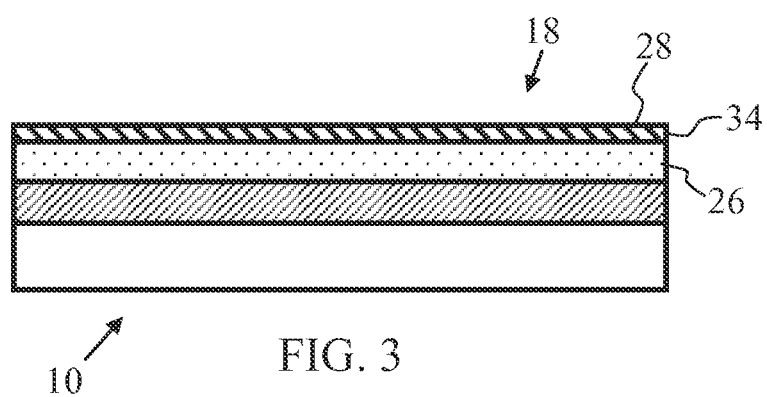

As shown in FIG. 3, fluorine is incorporated into the surface 28 of the high-k gate dielectric material 26 during the liquid-dielectric contact duration and forms a passivated layer 34 in the high-k gate dielectric material 26. Typically, the passivated layer 34 will have a thickness on the order of an atomic layer (the figures are not drawn to scale) and will have an atomic concentration of fluorine of about 10% or lower. At the stage of fabrication of the integrated circuit 10 shown in FIG. 3, a number of post-fluorine incorporation steps may be taken. For example, the integrated circuit 10 may be thermally treated to reposition the fluorine in the gate stack 18. Alternate or additional process steps can include the deposition of additional high-k dielectric layers or deposition and diffusion of metal layers as discussed below.

The fluorine passivation process shown in FIGS. 1-3 is particularly suited for use with high-k dielectric material that is not vulnerable to removal by the fluorine-containing liquid 30. For example, non-amorphous high-k dielectric such as polycrystalline high-k dielectric typically can withstand the fluorine-containing liquid 30. Therefore, the process can include thermally treating the gate stack 18 shown in FIG. 1 to crystallize the high-k gate dielectric material 26 into polycrystalline state. In an exemplary embodiment, thermal treatment involves heating the gate stack 18 to over 400° C., for example over 500° C. or about 600° C. such heat treatment would be performed before the fluorine incorporation process.

Figure 4:
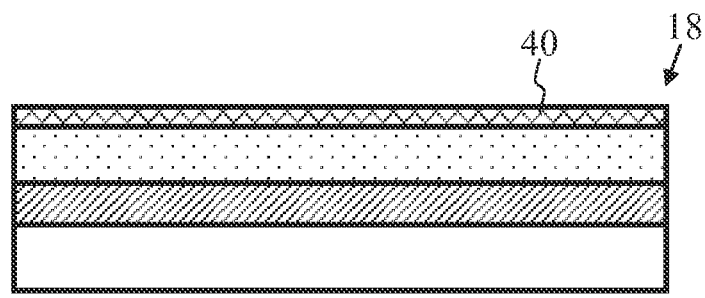
Figure 5:
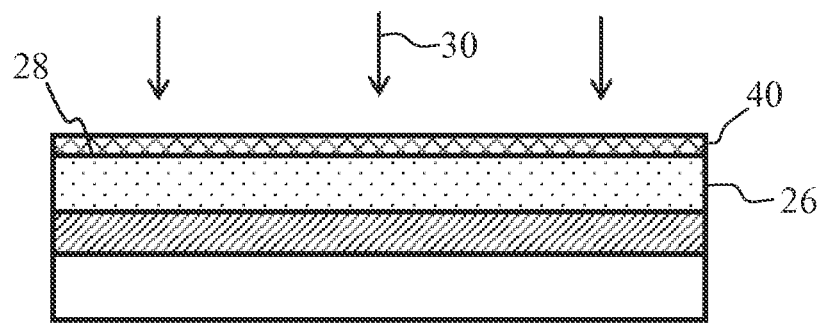
Figure 6:
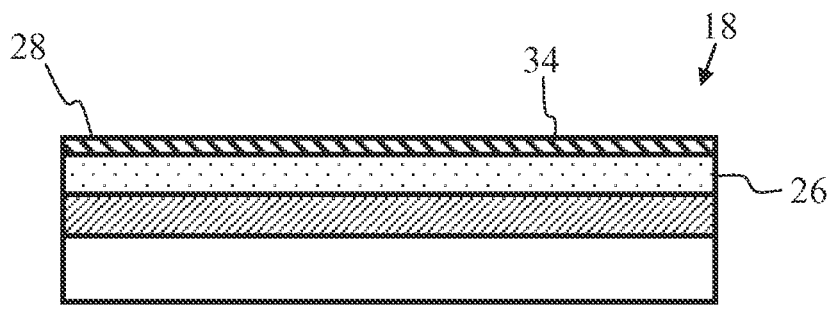

On the other hand, amorphous high-k gate dielectric material 26 may be vulnerable to removal by the fluorine-containing liquid 30. Therefore, to protect amorphous high-k gate dielectric material 26 from being removed by the fluorine-containing liquid 30, a capping layer 40 can deposited onto the gate stack 18 of FIG. 1 as shown in FIG. 4. The capping layer 40 is typically thin, such as about 2 Angstroms to 3 Angstroms. In FIG. 5, fluorine-containing liquid 30 is flowed onto the capping layer 40. The fluorine-containing liquid 30 is able to remove the capping layer 40 and passivate the high-k gate dielectric material 26 by penetrating fluorine into the surface 28, as shown in FIG. 6. As discussed above, the incorporation of fluorine into the high-k gate dielectric material 26 forms passivated layer 34. Again, at the stage of fabrication for the integrated circuit 10 shown in FIG. 6, various process steps may be performed, including thermal treatment to reposition the fluorine in the gate stack 18, deposition of dielectric layers, or deposition and diffusion of metal layers as discussed below.

In order to protect the high-k gate dielectric material 26 from removal by the fluorine-containing liquid 30, the capping layer 40 can be selected in cooperation with the specific fluorine-containing liquid 30 used. In an exemplary embodiment using dHF as the fluorine-containing liquid 30, the capping layer 40 is titanium nitride (TiN).

Figure 7:
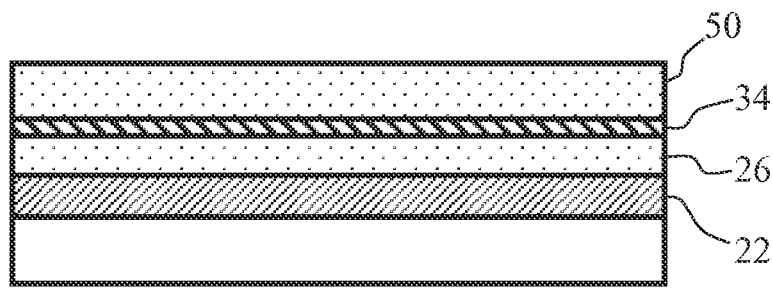

In FIG. 7, an additional layer of high-k dielectric material 50 is deposited over the passivated high-k dielectric material 26 of the partially fabricated integrated circuits 10 of FIGS. 3 and 6. As a result, the fluorine-incorporated passivated layer 34 is positioned in the middle of a high-k dielectric stack. Thermal treatment may then be performed to reposition the fluorine in the high-k dielectric layers 26, 50. In the embodiment of FIG. 7, the thickness of the high-k dielectric material 26 is at least about 10 Angstroms so that the incorporate fluorine does not diffuse into the gate oxide 22. The additional layer of high-k dielectric material 50 may also have a thickness of 10 Angstroms.

Figure 8:
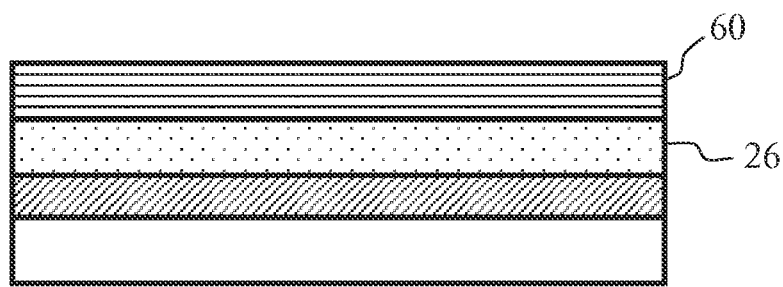

FIG. 8 illustrates an alternate embodiment in which additional process steps involving metal diffusion are performed. Specifically, a stack of workfunction metal layer(s), diffusion layer(s) and capping layer(s), generally designated by reference number 60, are blanket deposited over the high-k gate dielectric material 26 according to known techniques. Annealing processes are performed to provide a desired diffusion of metals into the high-k gate dielectric material 26. The stack 60 is then removed from the high-k gate dielectric material 26. The metal deposition, diffusion, and removal steps may be repeated with other stacks 60 for selected diffusion effects.

Figure 9:
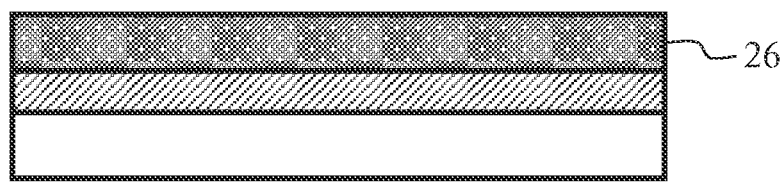
Figure 10:
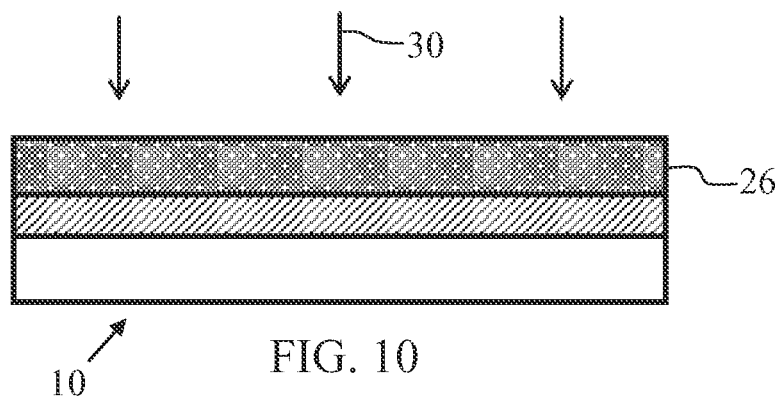
Figure 11:
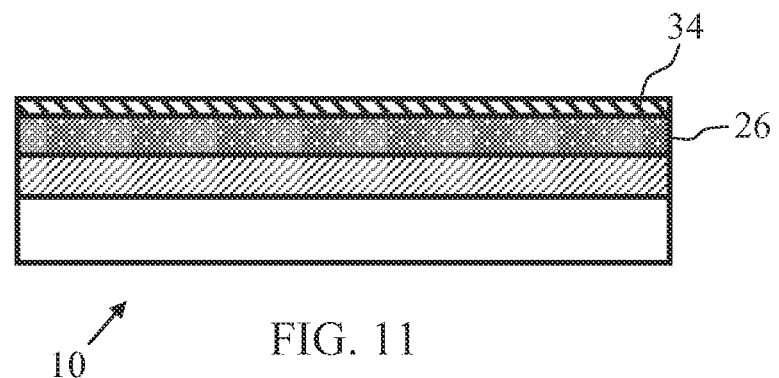
Figure 12:
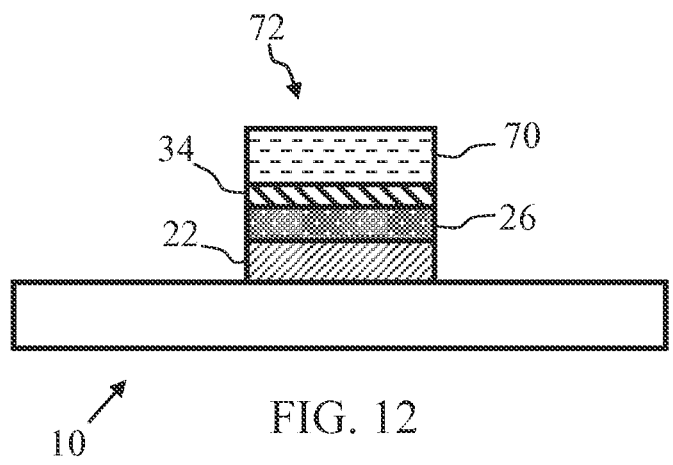

In FIG. 9, the stack 60 has been removed from the metal-diffused high-k gate dielectric material 26. The partially fabricated integrated circuit 10 may then be further processed. For example, in FIG. 10, a fluorine-containing liquid 30 may be flowed into contact with the metal-diffused high-k dielectric material 26, resulting in the incorporation of fluorine into the metal-diffused high-k gate dielectric material 26 and formation of the passivated layer 34 shown in FIG. 11. Thereafter, a final layer of metal(s) 70 is deposited, and the stack 18 is patterned for formation of the high-k metal gate structure 72, as shown in FIG. 12. While the structure 72 is illustrated as including a gate oxide layer 22, a metal-diffused high-k dielectric material 26, passivated layer 34, and final metal layer 70, the final structure 72 may vary depending on its intended function or desired process.

Figure 13:
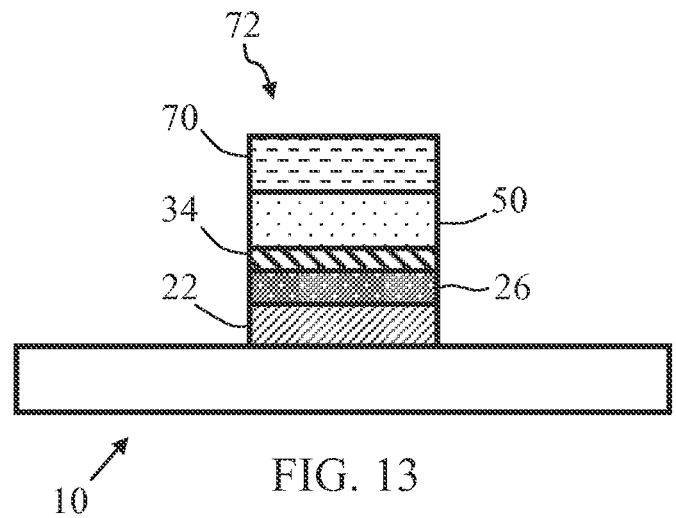
Figure 14:
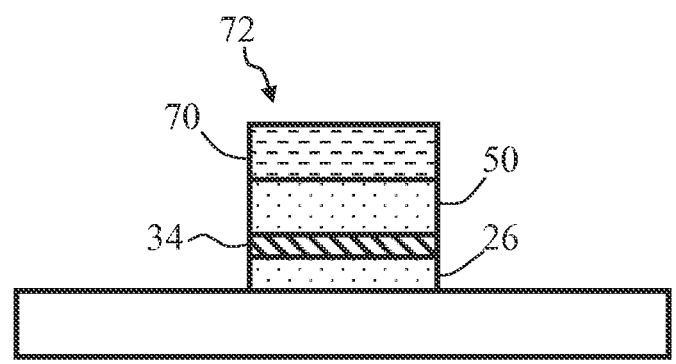
Figure 15:
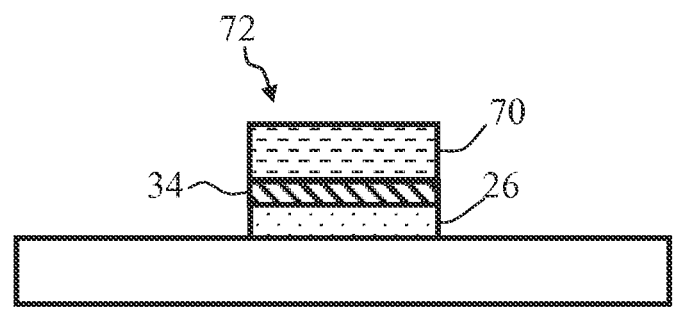

For example, in FIG. 13, the metal layer 70 is deposited over an additional layer of high-k dielectric material 50 before patterning for formation of the high-k metal gate structure 72. Further, as shown in FIG. 14, the gate oxide layer may not be included in the high-k metal gate structure 72. The high-k metal gate structure 72 of FIG. 14 includes a high-k dielectric material layer 26 with a passivated layer 34, an additional layer of high-k dielectric material 50, and the metal layer 70. In a simplest embodiment shown in FIG. 15, only the high-k dielectric material 26 with passivation layer 34 and metal layer 70 are patterned to form the high-k metal gate structure 72. Again, these illustrated embodiments are merely possibilities and the final structure 72 may vary depending on its intended function or desired process. Further, additional layers, such as diffusion or capping layers, may be included in the structure 72.

As described above, fabrication processes are implemented to form integrated circuits with passivated high-k dielectric material. Conventional plasma passivation processes are difficult to control and often cause damage to gate structures. These issues are avoided by incorporating fluorine from a fluorine-containing liquid into the high-k dielectric material. As a result, the high-k dielectric material is passivated and gate structure reliability is improved.

To briefly summarize, the fabrication methods described herein result in improved gate reliability and greater control of processing. While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. A method for fabricating an integrated circuit comprising:
   providing a semiconductor substrate;
   forming a gate structure on the semiconductor substrate, the gate structure including a high-k dielectric material;
   depositing a workfunction metal layer over the high-k dielectric material;
   stripping the workfunction metal layer from the high-k dielectric material before contacting a fluorine-containing liquid with the high-k dielectric material and incorporating fluorine into the high-k dielectric material; and
   depositing a final metal layer over the fluorine-incorporated high-k dielectric material.

2. The method of claim 1 further comprising crystallizing the high-k dielectric material to form polycrystalline high-k dielectric material before contacting the fluorine-containing liquid with the high-k dielectric material.

3. The method of claim 1 further comprising depositing a capping layer over the high-k dielectric material before contacting the fluorine-containing liquid with the high-k dielectric material.

4. The method of claim 3 further comprising removing the capping layer with the fluorine-containing liquid while contacting the fluorine-containing liquid with the high-k dielectric material.

5. The method of claim 1 wherein forming the gate structure comprises forming a hafnium oxide ($HfO_2$) gate material over the semiconductor substrate, and wherein contacting comprises contacting diluted hydrofluoric acid (dHF) with the hafnium oxide gate material to incorporate fluorine into the hafnium oxide gate material.

6. The method of claim 1 further comprising depositing an additional layer of high-k dielectric material onto the gate structure after contacting the fluorine-containing liquid with the high-k dielectric material.

7. The method of claim 1 wherein forming the gate structure on the semiconductor substrate comprises forming a first layer of the high-k dielectric material having a thickness of at least about 10 Angstroms, wherein contacting comprises contacting the fluorine-containing liquid with the first layer of the high-k dielectric material and incorporating fluorine into the first layer of the high-k dielectric material, and wherein the method further comprises depositing an additional layer of high-k dielectric material onto the fluorine-incorporated first layer of the high-k dielectric material.

8. The method of claim 1 further comprising thermally treating the fluorine-incorporated high-k dielectric material to diffuse the fluorine in the gate structure.

9. A method for fabricating an integrated circuit comprising:
   forming a high-k dielectric gate material on a semiconductor substrate;
   crystallizing the high-k dielectric gate material to form a polycrystalline high-k dielectric gate material; and
   passivating the polycrystalline high-k dielectric gate material by applying a fluorine-containing liquid to the high-k dielectric gate material.

10. The method of claim 9 further comprising depositing a workfunction metal over the passivated polycrystalline high-k dielectric gate material.

11. The method of claim 9 wherein forming the high-k dielectric gate material comprises depositing a hafnium oxide ($HfO_2$) gate material over the semiconductor substrate, and wherein applying comprises applying diluted hydrofluoric acid (dHF) to the hafnium oxide gate material to incorporate fluorine into the hafnium oxide gate material.

12. A method for fabricating an integrated circuit comprising:
   forming a high-k dielectric gate material on a semiconductor substrate;
   passivating the high-k dielectric gate material by applying a fluorine-containing liquid to the high-k dielectric gate material; and
   depositing a capping layer over the high-k dielectric gate material before applying the fluorine-containing liquid to the high-k dielectric gate material.

13. The method of claim 12 further comprising crystallizing the high-k dielectric gate material to form a polycrystalline high-k dielectric gate material before applying the fluorine-containing liquid to the high-k dielectric gate material.

14. The method of claim 12 further comprising removing the capping layer with the fluorine-containing liquid while applying the fluorine-containing liquid to the high-k dielectric gate material.

15. A method for fabricating an integrated circuit comprising:
   forming a high-k dielectric gate material on a semiconductor substrate;
   passivating the high-k dielectric gate material by applying a fluorine-containing liquid to the high-k dielectric gate material; and
   depositing an additional layer of high-k dielectric material onto the gate material after applying the fluorine-containing liquid to the high-k dielectric material.

16. The method of claim 15 further comprising:
   depositing a workfunction metal layer over the high-k dielectric material;
   stripping the workfunction metal layer from the high-k dielectric material before contacting the fluorine-containing liquid with the high-k dielectric material and incorporating fluorine into the high-k dielectric material; and
   depositing a final metal layer over the fluorine-incorporated high-k dielectric material.

17. A method for fabricating an integrated circuit comprising:
   forming a high-k dielectric gate material on a semiconductor substrate;
   depositing a capping layer over the high-k dielectric gate material;
   flowing a fluorine-containing liquid onto the capping layer, wherein the fluorine-containing liquid removes the capping layer and incorporates fluorine into the high-k dielectric gate material to form a fluorine-passivated layer within the high-k dielectric gate material.

18. The method of claim 17 wherein forming comprises depositing hafnium oxide; wherein depositing the capping layer comprises forming a titanium nitride layer over the hafnium oxide, and wherein flowing the fluorine-containing liquid comprises contacting diluted HF with the hafnium oxide and titanium nitride.

19. The method of claim 17 further comprising depositing an additional layer of high-k dielectric gate material over the fluorine-incorporated high-k dielectric gate material to form a high-k dielectric gate material.

20. The method of claim 17 further comprising:
depositing a workfunction metal layer over the high-k dielectric gate material; and
stripping the workfunction metal layer from the high-k dielectric gate material before depositing the capping layer over the high-k dielectric material.

* * * * *